US011404505B2

(12) United States Patent
Wang

(10) Patent No.: US 11,404,505 B2
(45) Date of Patent: Aug. 2, 2022

(54) DISPLAY SUBSTRATE, INK-JET PRINTING METHOD THEREOF, AND DISPLAY APPARATUS

(71) Applicants: Hefei BOE Joint Technology Co., Ltd., Anhui (CN); BOE Technology Group Co., Ltd., Beijing (CN)

(72) Inventor: Xinxin Wang, Beijing (CN)

(73) Assignees: Hefei BOE Joint Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 26 days.

(21) Appl. No.: 16/923,114

(22) Filed: Jul. 8, 2020

(65) Prior Publication Data

US 2021/0098744 A1 Apr. 1, 2021

(30) Foreign Application Priority Data

Sep. 26, 2019 (CN) .......................... 201910918878.6

(51) Int. Cl.
*H01L 51/52* (2006.01)
*H01L 51/56* (2006.01)
(Continued)

(52) U.S. Cl.
CPC ...... *H01L 27/3246* (2013.01); *H01L 51/0005* (2013.01); *H01L 51/0028* (2013.01); *H01L 51/5246* (2013.01); *H01L 51/5253* (2013.01); *H01L 51/5259* (2013.01); *H01L 51/56* (2013.01)

(58) Field of Classification Search
CPC ........................ H01L 27/3246; H01L 51/0005
See application file for complete search history.

(56) References Cited

U.S. PATENT DOCUMENTS

| 11,282,905 B2* | 3/2022 | Park | .................... H01L 27/3272 |
| 2003/0127657 A1* | 7/2003 | Park | .................... H01L 27/3246 257/79 |

(Continued)

FOREIGN PATENT DOCUMENTS

| CN | 108878689 A | * 11/2018 | ......... H01L 27/3246 |
| CN | 108878689 A | 11/2018 | |

(Continued)

OTHER PUBLICATIONS

Machine translation, Hu, Chinese Pat. Pub. No. CN 108878689A, translation date: Sep. 29, 2021, Espacenet, all pages. (Year: 2021).*

(Continued)

*Primary Examiner* — Victoria K. Hall
(74) *Attorney, Agent, or Firm* — Ling Wu; Stephen Yang; Ling and Yang Intellectual Property

(57) ABSTRACT

A display substrate, an ink-jet printing method thereof and a display apparatus are provided. The display substrate includes a base substrate. A plurality of pixel definition layers is disposed on the base substrate, and a sub-pixel region is formed between pixel definition layers. A pixel definition layer includes a first definition layer disposed on the base substrate, and the first definition layer adopts a hydrophilic material. The first definition layer includes an expansion layer capable of changing the thickness of the first definition layer.

18 Claims, 3 Drawing Sheets

(51) Int. Cl.
*H01L 51/00* (2006.01)
*H01L 27/32* (2006.01)

(56) References Cited

U.S. PATENT DOCUMENTS

| | | | | |
|---|---|---|---|---|
| 2004/0009303 | A1* | 1/2004 | Ito | H01L 27/3246 313/483 |
| 2006/0255735 | A1* | 11/2006 | Moriya | G03F 7/40 313/610 |
| 2007/0249776 | A1* | 10/2007 | Chen | G02F 1/133512 524/495 |
| 2010/0075237 | A1* | 3/2010 | Ishizeki | H01L 51/56 430/7 |
| 2012/0119201 | A1* | 5/2012 | Ueno | H01L 51/5048 257/40 |
| 2013/0189623 | A1* | 7/2013 | Kim | G03F 7/004 430/270.1 |
| 2015/0044790 | A1* | 2/2015 | Tsai | G03F 7/40 438/26 |
| 2016/0118630 | A1* | 4/2016 | Choi | B41M 5/46 156/230 |
| 2018/0180995 | A1* | 6/2018 | Choi | G03F 7/038 |
| 2018/0182989 | A1* | 6/2018 | Paek | H01L 27/3248 |
| 2018/0190739 | A1* | 7/2018 | Paek | H01L 51/5209 |
| 2018/0286934 | A1* | 10/2018 | Zhao | H01L 51/56 |
| 2019/0131578 | A1* | 5/2019 | Lee | H01L 51/5271 |
| 2019/0181195 | A1* | 6/2019 | Wang | H01L 27/3283 |
| 2019/0206946 | A1* | 7/2019 | Xu | H01L 51/56 |
| 2019/0206955 | A1* | 7/2019 | Paek | H01L 27/326 |
| 2019/0221621 | A1* | 7/2019 | Cui | H01L 51/5221 |
| 2019/0371871 | A1* | 12/2019 | He | H01L 27/1214 |
| 2020/0110337 | A1* | 4/2020 | Tanigaki | H05B 33/22 |
| 2020/0144350 | A1* | 5/2020 | Han | H01L 27/3272 |
| 2020/0194520 | A1* | 6/2020 | Seo | H01L 27/3218 |
| 2020/0203448 | A1* | 6/2020 | Kim | H01L 51/5209 |
| 2020/0203449 | A1* | 6/2020 | Jeon | H01L 27/3246 |
| 2020/0212128 | A1* | 7/2020 | Son | H01L 27/3246 |
| 2020/0219949 | A1* | 7/2020 | Zhang | H01L 51/0011 |
| 2020/0258959 | A1* | 8/2020 | Mao | H01L 51/0026 |
| 2020/0319549 | A1* | 10/2020 | Tanigaki | C08G 73/1042 |
| 2021/0020721 | A1* | 1/2021 | Kwack | H01L 27/3276 |
| 2021/0191264 | A1* | 6/2021 | Tanigaki | C07C 251/66 |
| 2021/0242423 | A1* | 8/2021 | Lee | H01L 27/322 |
| 2021/0249489 | A1* | 8/2021 | Hou | H01L 51/5284 |

FOREIGN PATENT DOCUMENTS

| | | | | |
|---|---|---|---|---|
| CN | 109524439 | A * | 3/2019 | H01L 27/32 |
| CN | 109524439 | A | 3/2019 | |
| CN | 109830513 | A * | 5/2019 | H01L 27/32 |
| CN | 109830513 | A | 5/2019 | |
| EP | 2713399 | A * | 4/2014 | H01L 27/3246 |
| EP | 2713399 | A2 | 4/2014 | |
| KR | 10-2016-0094525 | A * | 8/2016 | H01L 27/3246 |
| KR | 10-2017-0079645 | | * 7/2017 | H01L 27/32 |

OTHER PUBLICATIONS

Machine translation, Luo, Chinese Pat. Pub. No. CN 109524439A, translation date: Sep. 29, 2021, Espacenet, all pages. (Year: 2021).*
Machine translation, Gong, Chinese Pat. Pub. No. CN 109830513A, translation date: Sep. 29, 2021, Espacenet, all pages. (Year: 2021).*
Machine translation, Lee, Korean Pat. Pub. No. KR 20170079645A, translation date: Sep. 29, 2021, Espacenet, all pages. (Year: 2021).*
First Office Action, The State Intellectual Property Office of People's Republic of China, dated Jul. 16, 2021, all pages. (Year: 2021).*
Search Report, The State Intellectual Property Office of People's Republic of China, dated Jul. 12, 2021, all pages. (Year: 2021).*
Machine translation, Shin, Korean Pat. Pub. No. KR 10-2016-0094525A, translation date: Apr. 12, 2022, Espacenet, all pages. (Year: 2022).*
Office Action dated Jul. 16, 2021 for Chinese Patent Application No. 201910918878.6 and English Translation.

* cited by examiner

DISPLAY SUBSTRATE, INK-JET PRINTING METHOD THEREOF, AND DISPLAY APPARATUS

CROSS-REFERENCE TO RELATED APPLICATION

The present application claims the priority of Chinese Patent Application No. 201910918878.6 filed to the CNIPA on Sep. 26, 2019, the content of which is hereby incorporated by reference.

TECHNICAL FIELD

The present disclosure relates to, but is not limited to the technical field of display, specifically to a display substrate and an ink-jet printing method thereof, and a display apparatus.

BACKGROUND

An Organic Light-Emitting Diode (OLED) has advantages of self-luminescence, fast response, wide viewing angle, high brightness, bright color, thinness, etc., compared with Liquid Crystal Display (LCD), and is considered as a next generation of display technology.

SUMMARY

The following is a summary of the subject matter described in detail herein. This summary is not intended to limit the protection scope of the claims.

A display substrate includes a base substrate. Pixel definition layers are disposed on the base substrate, and a sub-pixel region is formed between pixel definition layers. A pixel definition layer includes a first definition layer disposed on the base substrate, and the first definition layer includes a hydrophilic material. The first definition layer includes an expansion layer capable of changing a thickness of the first definition layer.

In an exemplary implementation, a material of the expansion layer includes a thermal expansion material.

In an exemplary implementation, the thermal expansion material includes at least one of a mixed material of alkali metal silicate and polyol, zirconium dioxide, molybdenum, or a negative thermal expansion material.

In an exemplary implementation, the negative thermal expansion material includes Mn3XN or ZrW2O8, and X in the Mn3XN is zinc (Zn), copper (Cu) or aluminum (Al).

In an exemplary implementation, the pixel definition layer further includes a second definition layer disposed on a side of the first definition layer away from the base substrate, and wherein the second definition layer includes a hydrophobic material.

In an exemplary implementation, the area of the bottom surface of the second definition layer is larger than the area of the top surface of the first definition layer, and a protruding surface surrounding the top surface of the first definition layer is formed on the bottom surface of the second definition layer.

In an exemplary implementation, the area of the protruding surface is 20%-30% of the area of the top surface of the first definition layer.

In an exemplary implementation, the second definition layer includes a hydrophobic material.

In an exemplary implementation, the hydrophobic material is a material having repellency to ink in which an organic electroluminescent material is dissolved.

In an exemplary implementation, a material of the second definition layer includes fluorinated polymethyl methacrylate or fluorinated polyimide.

In an exemplary implementation, a vertical cross section of the second definition layer has the shape of a regular trapezoid.

In an exemplary implementation, a vertical cross section of the first definition layer has the shape of a regular trapezoid.

In an exemplary implementation, the thickness of the first definition layer is 50 nm to 100 nm.

In an exemplary implementation, a pixel film layer is formed on the sub-pixel region, and the thickness of the pixel film layer is not greater than the thickness of the first definition layer.

In an exemplary implementation, the hydrophilic material is a material having attraction to a solution in which an organic electroluminescent material is dissolved.

In an exemplary implementation, the expansion layer constitutes all or part of the first definition layer.

In an exemplary implementation, the expansion layer is a part of the first definition layer, and the other part of the first definition layer includes other non-expansion hydrophilic material.

In an exemplary implementation, the non-expansion hydrophilic material includes one of polyisoprene, polystyrene or epoxy resin.

The embodiments of the present disclosure further provide a display apparatus including any one of the above described display substrates.

An embodiment of the present disclosure further provides an ink-jet printing method of a display substrate as described above. The ink-jet printing method of the display substrate includes: determining the thickness of a pixel film layer to be formed in a sub-pixel region of the display substrate; adjusting the thickness of the first definition layer on the display substrate according to the thickness of the pixel film layer, so that the thickness of the first definition layer is not less than the thickness of the pixel film layer; and dripping printing ink into the sub-pixel region of the display substrate, and drying the printing ink, so as to form the pixel film layer.

Other aspects will become apparent upon reading and understanding the drawings and detailed description.

BRIEF DESCRIPTION OF DRAWINGS

Accompanying drawings are used for providing a further understanding of technical schemes of the present disclosure and form a part of the specification. Together with embodiments of the present disclosure, the accompanying drawings are used for explaining technical schemes of the present disclosure and do not constitute a limitation on the technical schemes of the present disclosure. Shapes and sizes of the components in the drawings do not reflect real proportions, and are only for the purpose of schematically illustrating contents of the present disclosure.

DETAILED DESCRIPTION

Figure 1:
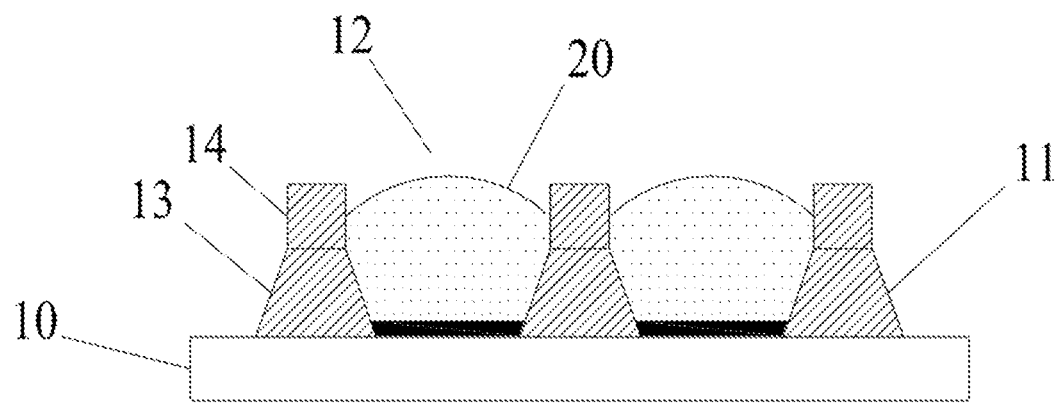
FIG. 1 is a schematic diagram of structure of a display substrate after a film is formed by printing ink.

Embodiments herein may be implemented in multiple different forms. One of ordinary skill in the art can easily understand a fact that implementation modes and implementation contents can be changed into various forms without departing from the principle and scope of the present disclosure. Therefore, the present disclosure should not be construed to only define the content described in the following embodiments. Without a conflict, the embodiments in the present disclosure and the features in the embodiments may be combined with each other arbitrarily.

Film formation approaches of an organic light-emitting diode (OLED) mainly include a vapor deposition process or a solution process. The vapor deposition process is relatively mature in small-size applications, and at present it has been applied for mass production. However, this technology is expensive in materials and low in material utilization, increasing the cost of product development. The solution process in the OLED film formation approaches mainly include ink-jet printing, nozzle coating, spin coating, screen printing, etc. The ink-jet printing technology is considered as an important way to realize mass production of large-size OLEDs due to its high material utilization and a capability of large-size implementation.

In order to form an organic functional layer in the OLED by ink-jet printing technology, a pixel definition layer (PDL) needs to be manufactured on an electrode of the base substrate in advance to define the printing ink to accurately flow into a designated R/G/B sub-pixel region, and the printing ink needs to be fully spread in the sub-pixel region without overflowing.

The pixel definition layer adopts a two-layer structure stacked in an upper-lower configuration, that is, adopts a two-function material with a top portion having a low surface energy and a bottom portion having a high surface energy. The top portion of the pixel definition layer has a low surface energy, so that the surface layer has hydrophobicity to ensure printing ink will not overflow, and the bottom portion of the pixel definition layer has a high surface energy, so that the bottom layer has hydrophilicity to avoid uneven film formation of printing ink in the drying process. However, at present the thickness of the bottom portion of the pixel definition layer cannot be changed, resulting in that a creep-up point of the bottom portion of the pixel definition layer cannot be changed. As a result, it often occurs that the creep-up point of the printing ink dripped into the sub-pixel region is higher than the thickness of the bottom portion of the pixel definition layer, so that a part of the top portion of the printing ink contacts with the top portion of the pixel definition layer. In this case, the printing ink forms an arched uneven film with a thicker center and two thinner edges during the drying process due to the hydrophobicity of the top portion of the pixel definition layer. Such uneven film easily leads to uneven light emission of a display device, and thus affects the service life of the display device.

FIG. 1 is a schematic diagram of structure of a display substrate after a film is formed by printing ink. As shown in FIG. 1, the display substrate includes a base substrate 10. Pixel definition layers 11 are disposed on the base substrate 10, and a sub-pixel region 12 for containing printing ink is formed between pixel definition layers 11. The pixel definition layer 11 in the display substrate includes a first definition layer 13 and a second definition layer 14 sequentially stacked from bottom to top. The first definition layer 13 adopts a hydrophilic material and the second definition layer 14 adopts a hydrophobic material. Since a creep-up point of the first definition layer 13 in the display substrate cannot be changed, it often occurs that a part of the printing ink dripped into the sub-pixel region 12 is present in the second definition layer 14, thus resulting in that the printing ink is squeezed during a drying process of the printing ink due to the hydrophobicity of the second definition layer 14, so that a pixel film layer 20 with an uneven thickness of a thicker center and two thinner edges is formed. Such pixel film layer 20 with the uneven thickness easily leads to uneven light emission of a display device, and thus affects a service life of the display device.

An embodiment of the present disclosure provides a display substrate including a base substrate. Pixel definition layers are disposed on the base substrate, and a sub-pixel region is formed between the pixel definition layers. A pixel definition layer includes a first definition layer located at the side of the pixel definition layer close to the base substrate. The first definition layer adopts a hydrophilic material, and the first definition layer includes an expansion layer capable of changing the thickness of the first definition layer.

According to the display substrate provided by the present disclosure, the thickness of the hydrophilic first definition layer is adjusted through the expansion layer. In the drying process, the thickness of the formed pixel film layer is always not greater than the thickness of the first definition layer, so that uniformity of the thickness of the film formed by the printing ink is ensured, uniformity of light emitted by the display device is improved, and the service life of the display device is prolonged. In addition, the display substrate of the present disclosure may form pixel film layers with different thicknesses, and uniformity of the thickness of the formed pixel film layer can be ensured merely by adjusting the thickness of the expansion layer.

Figure 2:
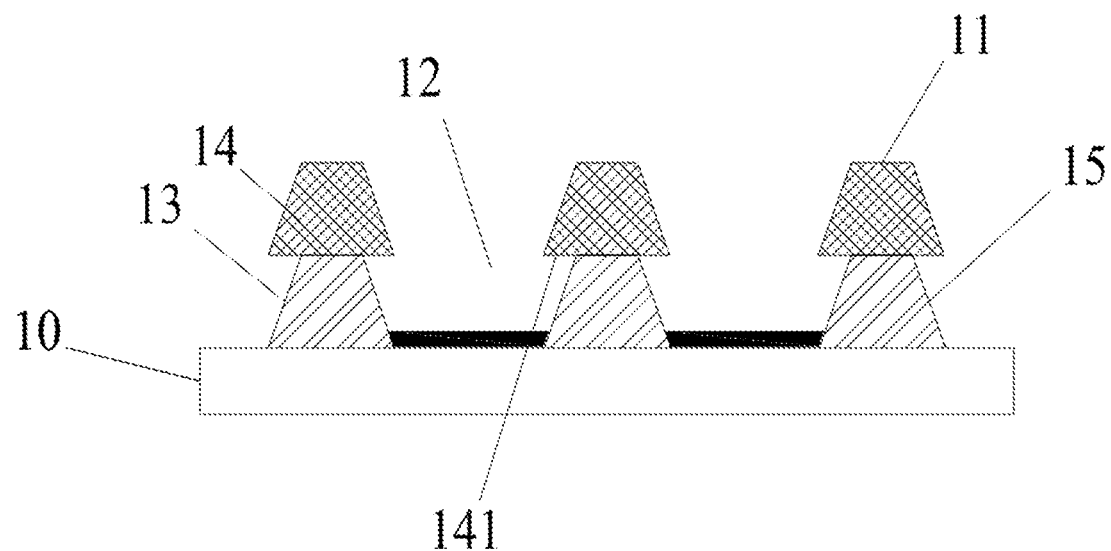
FIG. 2 is a schematic diagram of structure of a display substrate according to an embodiment of the present disclosure.

FIG. 2 is a schematic diagram of structure of a display substrate according to an embodiment of the present disclosure. As shown in FIG. 2, the display substrate of the embodiment of the present disclosure is an organic light emitting diode display panel including a base substrate 10. The pixel definition layers 11 are disposed on the base substrate 10, and a sub-pixel region 12 for containing printing ink is formed between pixel definition layers 11. The pixel definition layer 11 has a two-layer structure sequentially stacked from bottom to top, i.e., the pixel definition layer 11 includes a first definition layer 13 disposed on the base substrate 10 and a second definition layer 14 disposed on the side of the first definition layer 13 away from the base substrate 10.

In an exemplary implementation, the second definition layer 14 adopts a hydrophobic material, which can restrict the printing ink to drip into the designated sub-pixel region 12, effectively control the creep-up of the printing ink on the pixel definition layer 11, and ensure that the printing ink will not overflow. The hydrophobic material is a material having repellency to ink in which an organic electroluminescent material is dissolved. In an exemplary implementation, the material of the second definition layer 14 may adopt a variety of hydrophobic materials, for example, the material of the second definition layer 14 adopts fluorinated polymethyl methacrylate or fluorinated polyimide, or other hydrophobic material.

In an exemplary implementation, the first definition layer 13 adopts a hydrophilic material. Due to the property of the hydrophilic material, the first definition layer 13 can be more attractive to the printing ink so as to ensure that the printing ink dripped into the sub-pixel region 12 is completely and fully spread, so that the printing ink forms a uniform film during the drying process. The hydrophilic material is a material attractive to a solution in which an organic electroluminescent material is dissolved.

As shown in FIG. 2, the first definition layer 13 includes an expansion layer 15 capable of changing the thickness of the first definition layer. The expansion layer 15 may constitute all or part of the first definition layer 13. That is to say, the entire first definition layer 13 is formed by the expansion layer 15, or alternatively the expansion layer 15 is a part of the first definition layer 13, and the other part of the first definition layer 13 adopts other non-expansion hydrophilic material. For example, the other part of the first definition layer 13 may adopt one of polyisoprene, polystyrene or epoxy resin.

In an exemplary implementation, the material of the expansion layer 15 may adopt a variety of expansion materials, for example, the material of the expansion layer 15 adopts a thermal expansion material. The thermal expansion material may be at least one of a mixed material of alkali metal silicate and polyol, zirconium dioxide, molybdenum, or a negative thermal expansion material. The negative thermal expansion material may be $Mn_3XN$ or $ZrW_2O_8$, in which X in $Mn_3XN$ may be a metal element, such as zinc (Zn), copper (Cu), or aluminum (Al). The material of the expansion layer 15 is a thermal expansion material, so that the expansion layer 15 may expand as the temperature changes, thereby enabling the thickness of the first definition layer 13 to be changed accordingly, resulting in different creep-up points of the printing ink on the side surface of the first definition layer 13. Before the printing ink is dripped, the first definition layer 13 may be thermally treated according to the thickness of the formed pixel electrode layer, and the thickness of the first definition layer 13 may be adjusted to ensure that the thickness of the first definition layer 13 is not less than the thickness of the formed pixel film layer.

According to the display substrate of the embodiment of the present disclosure, the thickness of the hydrophilic first definition layer 13 is adjusted through the expansion layer 15. In the drying process, the thickness of the formed pixel film layer is always not greater than the thickness of the first definition layer 13, so that uniformity of the thickness of the film formed by the printing ink is ensured, uniformity of light emitted by the display device is improved, and the service life of the display device is prolonged. In addition, the display substrate of the present disclosure may form pixel film layers with different thicknesses, and uniformity of the thickness of the formed pixel film layer can be ensured merely by adjusting the thickness of the expansion layer 15.

In an exemplary implementation, the thickness of the first definition layer 13 is not limited as long as the thickness of the first definition layer 13 is not less than the thickness of the pixel film layer formed in the sub-pixel region 12. For example, the thickness of the first definition layer 13 is 50 nm to 100 nm.

As shown in FIG. 2, vertical cross sections of the first definition layer 13 and the second definition layer 14 are both regular trapezoids, i.e., widths of bottom surfaces of the first definition layer 13 and the second definition layer 14 are respectively greater than the width of a top surface of the first definition layer 13 and the width of a top surface of the second definition layer 14, so as to form bottom-to-top expansion structures at both sides of the first definition layer 13 and second definition layer 14 in a width direction, which can improve volume fraction of the sub-pixel region 12 and increase an effective display area of the sub-pixel region 12.

As shown in FIG. 2, the area of a bottom surface of the second definition layer 14 is larger than the area of a top surface of the first definition layer 13, and a protruding surface 141 surrounding the top surface of the first definition layer 13 is formed on the bottom surface of the second definition layer 14. The protruding surface 141 of the second definition layer 14 provides an expansion space for the expansion of the first definition layer 13, so as to prevent the aperture ratio of the sub-pixel region 12 from being reduced after the first definition layer 13 expands, thereby to prevent the effective display area of the sub-pixel region 12 from being reduced. The bottom surface of the second definition layer 14 refers to the surface on the side of the second definition layer 14 close to the base substrate 10, and the top surface of the first definition layer 13 refers to the surface on the side of the first definition layer 13 away from the base substrate 10.

As shown in FIG. 2, the area of the protruding surface 141 is 20%-30% of the area of the top surface of the first definition layer 13. The protruding surface 141 of this size can ensure that the aperture ratio of the sub-pixel region 12 will not be reduced after the expansion layer 15 in the first definition layer 13 expands.

The technical scheme of the present disclosure is described below through an example of a preparation process of the display substrate. The "patterning process" mentioned in the present disclosure includes the procedures such as deposition of a film layer, coating of a photoresist, mask exposure, development, etching, and stripping of photoresist, and is a mature preparation process in related art. Deposition may adopt a known process such as sputtering, vapor deposition, and chemical vapor deposition. Coating may adopt a known coating process, and etching may adopt a known method, which are not limited herein. In the description of the present disclosure, "thin film" refers to a layer of thin film formed from a certain material on a substrate through a depositing or coating process. If a patterning process or a photolithography process is not needed for the "thin film" during the whole forming process, the "thin film" may also be referred to as a "layer". If a patterning process or a photolithography process is needed for the "thin film" during the whole forming process, it is referred to as "thin film" before the patterning process, and referred to as "layer" after the patterning process. The "layer" after the patterning process or photolithography process contains at least one "pattern".

The first definition layer and the second definition layer on the substrate of the embodiment of the present disclosure may be prepared by the same preparation process, or may be respectively prepared by two preparation processes. Taking a case in which the first definition layer and the second definition layer are respectively prepared by two preparation processes as an example, FIGS. 3 to 6 are schematic diagrams showing the preparation process of the display substrate of the embodiment. The preparation process of the display substrate includes the following operation procedures.

Figure 3:
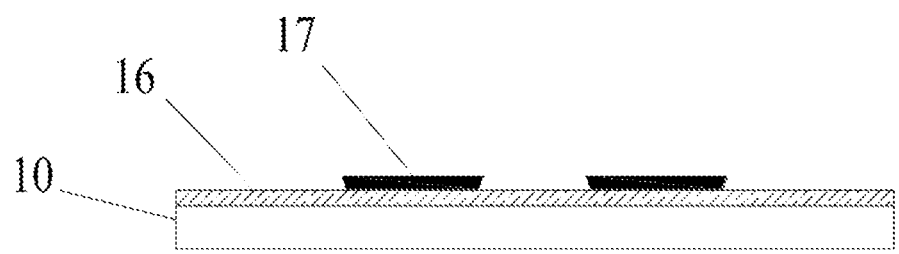
FIG. 3 is a schematic diagram of structure of a display substrate after a pixel electrode layer is formed according to an embodiment of the present disclosure.

1) Forming a flat layer 16 on the base substrate 10, depositing a metal film on the flat layer 16, and patterning the metal film by a patterning process to form a pixel electrode layer 17 on the base substrate 10, as shown in FIG. 3. The metal thin film may adopt a metal material, such as argentum (Ag), copper (Cu), aluminum (Al), or molybdenum (Mo), or an alloy material thereof, such as aluminum neodymium alloy AlNd, or molybdenum niobium alloy MoNb, or may adopt a multi-layer metal, such as molybdenum (Mo)/copper (Cu)/molybdenum (Mo), or may be a stacked structure formed by a metal and a transparent conductive material, such as indium tin oxide (ITO)/argentum (Ag)/indium tin oxide (ITO).

Figure 4:
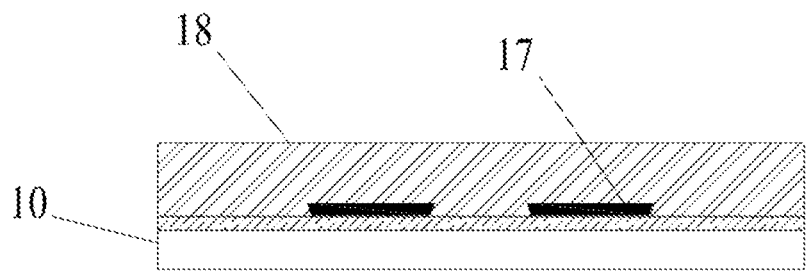
FIG. 4 is a schematic diagram of structure of a display substrate after a first thin film layer is formed according to an embodiment of the present disclosure.

2) Coating a hydrophilic first thin film layer 18 covering the entire base substrate 10 on the pixel electrode layer 17. Herein the material of the first thin film layer 18 is a thermal expansion material, so that the first thin film layer 18 has both hydrophilic and thermal expansion characteristics, as shown in FIG. 4.

Figure 5:
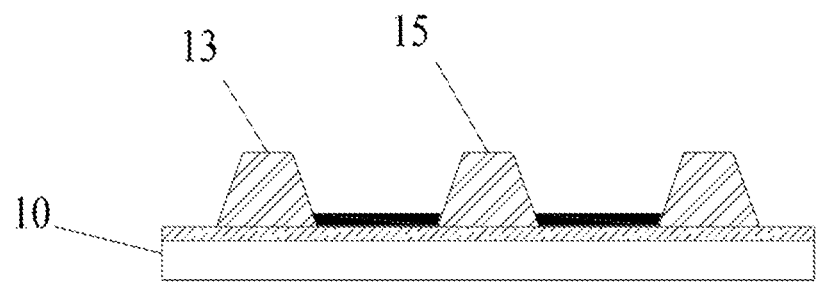
FIG. 5 is a schematic diagram of structure of a display substrate after a first definition layer is formed according to an embodiment of the present disclosure.

3) Etching the first thin film layer 18 through a patterning process, so that the first thin film layer 18 forms a regular trapezoidal expansion layer 15. The expansion layer 15 forms the first definition layer 13, as shown in FIG. 5.

Figure 6:
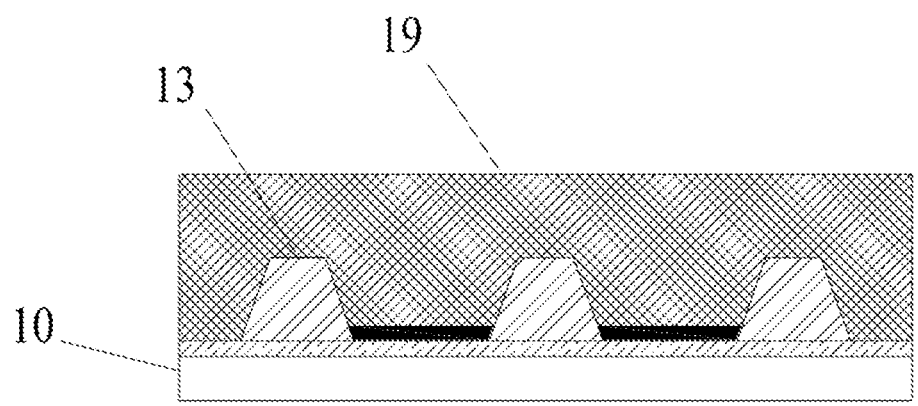
FIG. 6 is a schematic diagram of structure of a display substrate after a second thin film layer is formed according to an embodiment of the present disclosure.

4) Coating a hydrophobic second thin film layer 19 covering the entire base substrate 10 on the first definition layer 13, as shown in FIG. 6.

5) Etching the second thin film layer 19 through a patterning process, so that the second thin film layer 19 forms a regular trapezoidal second definition layer 14, as shown in FIG. 2.

In summary, the thickness of a film formed by the printing ink in the display substrate of the embodiment of the present disclosure is uniform and consistent, thereby improving the uniformity of light emitted by a display device and prolonging the service life of the display device.

Figure 7:
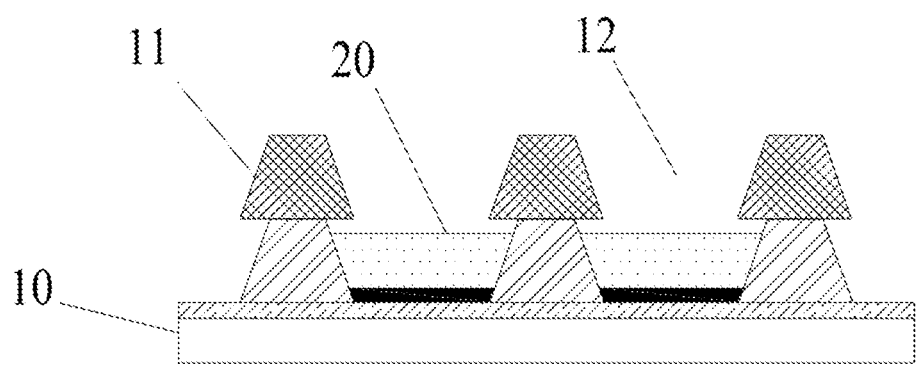
FIG. 7 is a schematic diagram of structure of a display substrate after a film is formed by printing ink according to an embodiment of the present disclosure.

FIG. 7 is a schematic diagram of structure of a display substrate after a film is formed by printing ink according to an embodiment of the present disclosure. The embodiment provides an ink-jet printing method of a display substrate, which includes the following steps S1-S3.

In S1, the thickness of the pixel film layer to be formed in a sub-pixel region of the display substrate is determined.

In S2, the thickness of the first definition layer on the display substrate is adjusted according to the thickness of the pixel film layer, so that the thickness of the first definition layer is not less than the thickness of the pixel film layer.

In S3, printing ink is dripped into the sub-pixel region 12 of the display substrate and the printing ink is dried, so as to form the pixel film layer 20 having a uniform thickness, as shown in FIG. 7.

The preparation process of the display substrate has been described in detail in the aforementioned embodiments and will not be repeated here.

According to the ink-jet printing method of the display substrate of the embodiment, the thickness of the hydrophilic first definition layer is adjusted, so that in the drying process, the thickness of the formed pixel film layer is always not greater than the thickness of the first definition layer, thereby uniformity of the thickness of the film formed by the printing ink is ensured, uniformity of light emitted by the display device is improved, and the service life of the display device is prolonged.

An embodiment of the present disclosure further provides a display apparatus including any one of the aforementioned display substrates. The display apparatus may be any product or component with a display function such as a mobile phone, a tablet computer, a television, a display, a notebook computer, a digital photo frame, a navigator, etc.

In the description of the present disclosure, it should be understood that orientation or position relationships indicated by terms "middle", "upper", "lower", "front", "rear", "vertical", "horizontal", "top", "bottom", "inside", "outside" and the like is based on the orientation or position relationship shown in the drawings, which is only for ease of description of the present disclosure and simplification of the description, rather than indicating or implying that the device or element referred to must have a specific orientation, or must be constructed and operated in a particular orientation, and therefore cannot be construed as limiting the present disclosure.

In the description of the present disclosure, it should be understood that unless otherwise clearly specified and defined, the terms "install", "connect", and "join" should be interpreted broadly, for example, it may refer to a fixed connection or a detachable connection, or an integrated connection; it may refer to a mechanical connection or an electrical connection; it may refer to a direct connection, or an indirect connection through an intermediary, or it may refer to an internal communication between two elements. For those of ordinary skill in the art, the specific meanings of the above terms in the present disclosure may be understood according to specific situations.

Although embodiments of the present disclosure are described in the above, the above embodiments are described only for better understanding, rather than restricting the present disclosure. Any person skilled in the art can make any modifications and variations in the forms and details of implementation without departing from the spirit and scope of the present disclosure. However, the protection scope of the present disclosure shall be defined by the claims.

What we claim is:

1. A display substrate, comprising:
   a base substrate,
   pixel definition layers disposed on the base substrate, and
   a sub-pixel region between the pixel definition layers;
   wherein the pixel definition layers comprise a first definition layer disposed directly on the base substrate, wherein the first definition layer comprises a hydrophilic material, and the first definition layer comprises an expansion layer for changing a thickness of the first definition layer.

2. The display substrate according to claim 1, wherein a material of the expansion layer comprises a thermal expansion material.

3. The display substrate according to claim 2, wherein the thermal expansion material comprises at least one of a mixed material of alkali metal silicate and polyol, zirconium dioxide, molybdenum, or a negative thermal expansion material.

4. The display substrate according to claim 3, wherein the negative thermal expansion material comprises at least one of $Mn_3ZnN$, $Mn_3CuN$, $Mn_3AlN$, or $ZrW_2O_8$.

5. The display substrate according to claim 1, wherein the pixel definition layers further comprise a second definition layer disposed on a side of the first definition layer away from the base substrate, and wherein the second definition layer comprises a hydrophobic material.

6. The display substrate according to claim 5, wherein an area of a bottom surface of the second definition layer is larger than an area of a top surface of the first definition layer, and the bottom surface of the second definition layer comprises a protruding surface surrounding the top surface of the first definition layer.

7. The display substrate according to claim 6, wherein an area of the protruding surface is 20%-30% of the area of the top surface of the first definition layer.

8. The display substrate according to claim 5, wherein the hydrophobic material is a material having repellency to ink in which an organic electroluminescent material is dissolved.

9. The display substrate according to claim 8, wherein the hydrophobic material comprises fluorinated polymethyl methacrylate or fluorinated polyimide.

10. The display substrate according to claim 5, wherein a vertical cross section of the second definition layer has a shape of a regular trapezoid.

11. The display substrate according to claim 1, wherein a vertical cross section of the first definition layer has a shape of a regular trapezoid.

12. The display substrate according to claim 1, wherein the thickness of the first definition layer is 50 nm to 100 nm.

13. The display substrate according to claim 1, further comprising a pixel film layer formed on the sub-pixel region, a thickness of the pixel film layer being not greater than the thickness of the first definition layer.

14. The display substrate according to claim 1, wherein the hydrophilic material is a material having attraction to a solution in which an organic electroluminescent material is dissolved.

15. The display substrate according to claim 1, wherein the expansion layer is a part of the first definition layer, and another part of the first definition layer comprises other non-expansion hydrophilic material.

16. The display substrate according to claim 15, wherein the non-expansion hydrophilic material comprises one of polyisoprene, polystyrene, or epoxy resin.

17. A display apparatus, comprising the display substrate according to claim 1.

18. An ink-jet printing method of the display substrate according to claim 1, the method comprising:
   determining a thickness of a pixel film layer to be formed in the sub-pixel region of the display substrate;
   adjusting the thickness of the first definition layer on the display substrate according to the thickness of the pixel film layer, to make the thickness of the first definition layer be not less than the thickness of the pixel film layer; and
   dripping printing ink into the sub-pixel region of the display substrate, and drying the printing ink, to form the pixel film layer.

\* \* \* \* \*